United States Patent
Sakurai

[11] Patent Number: 6,064,627
[45] Date of Patent: May 16, 2000

[54] SYNCHRONOUS SEMICONDUCTOR MEMORY DEVICE

[75] Inventor: Mikio Sakurai, Tokyo, Japan

[73] Assignee: Mitsubishi Denki Kabushiki Kaisha, Tokyo, Japan

[21] Appl. No.: 09/231,397

[22] Filed: Jan. 12, 1999

Related U.S. Application Data

[63] Continuation of application No. PCT/JP96/02781, Sep. 26, 1996.

[51] Int. Cl.[7] .................................................. G11C 8/00
[52] U.S. Cl. .............. 365/233; 365/189.05; 365/230.06; 365/230.08
[58] Field of Search ................................ 365/233, 230.06, 365/230.08, 189.05

[56] References Cited

U.S. PATENT DOCUMENTS

| | | | |
|---|---|---|---|
| 4,698,750 | 10/1987 | Wilkie | 365/185.04 |
| 5,226,015 | 7/1993 | Gotou et al. | 365/230.03 |
| 5,390,317 | 2/1995 | Weiss et al. | 365/185.04 |
| 5,615,151 | 3/1997 | Furuno et al. | 365/185.18 |
| 5,694,611 | 12/1997 | Matsubara | 365/185.04 |
| 5,784,328 | 7/1998 | Irrinki et al. | 365/222 |
| 5,880,992 | 3/1999 | Lee | 365/185.04 |
| 5,880,998 | 3/1999 | Tanimura et al. | 365/189.05 |

FOREIGN PATENT DOCUMENTS

| | | |
|---|---|---|
| 63-206852 | 8/1988 | Japan . |
| 64-23548 | 1/1989 | Japan . |
| 3-35498 | 2/1991 | Japan . |
| 7-93970 | 4/1995 | Japan . |
| 8-124380 | 5/1996 | Japan . |

*Primary Examiner*—David Nelms
*Assistant Examiner*—Gene N. Auduong
*Attorney, Agent, or Firm*—McDermott, Will & Emery

[57] ABSTRACT

The present invention relates to a synchronous semiconductor memory device and an object of the present invention is to provide a synchronous semiconductor memory device in which an operation mode such as a set burst length would not be lost even at the power off. Here, the synchronous semiconductor memory device according to the present invention includes non-volatile memory for storing operation mode and controlling data reading operation and data writing operation in accordance therewith.

1 Claim, 2 Drawing Sheets

SYNCHRONOUS SEMICONDUCTOR MEMORY DEVICE

REFERENCE TO RELATED APPLICATION

This Application is a continuation of International Application No. PCT/JP96/02781, whose international filing date is Sep. 26, 1996 the disclosures of which Application are incorporated by reference herein. The benefit of the filing and priority date of the International and Application is respectfully requested.

BACKGROUND OF THE INVENTION

1. Field of the Invention

The present invention relates generally to a semiconductor memory device, and more particularly to a synchronous semiconductor memory device operating in synchronization with a clock signal.

2. Description of the Background Art

In a synchronous semiconductor memory device (hereinafter referred to as an SDRAM) now available as a commercial product, Burst Length (BL), /CAS Latency (CL) and so on can be set in a mode register included in the device by a user at its use.

Here, Burst Length is a number of data read out or written into in sequence in one access cycle. In an SDRAM, BLs of 1, 2, 4 or 8 are available and some chips have a full page mode. /CAS Latency is a number of clock cycles elapsed from application of read instruction until an output of data from an output buffer. In an SDRAM, CLs=2, 3 in general are available and in some chips, CL=1, 4.

Though operation modes such as Burst Length and /CAS latency set in the mode register do not change until reset, at the power off the mode register is reset and the set information is lost.

SUMMARY OF THE INVENTION

An object of the present invention is to provide a synchronous semiconductor memory device wherein a set operation mode is not lost even at the power off.

The object of the present invention is achieved by providing a synchronous semiconductor memory device including a memory storing data, a clock buffer generating an internal clock signal by buffering an external clock signal, an input buffer generating an internal control signal in response to the internal clock signal by buffering an external control signal, an address buffer generating an internal address signal in response to the internal clock signal by buffering an external address signal, a read circuit reading data from the memory, a write circuit writing external data into the memory, and, a non-volatile memory section storing an operation mode in accordance with the internal control signal and the internal address signal and controlling the read circuit and the write circuit in accordance with the operation mode.

A main advantage of the present invention lies in that the synchronous semiconductor memory device can be restarted in an operation mode stored in the non-volatile memory section without need of operation mode setting at the next power on after the power off, because the operation mode is stored in the non-volatile memory section.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
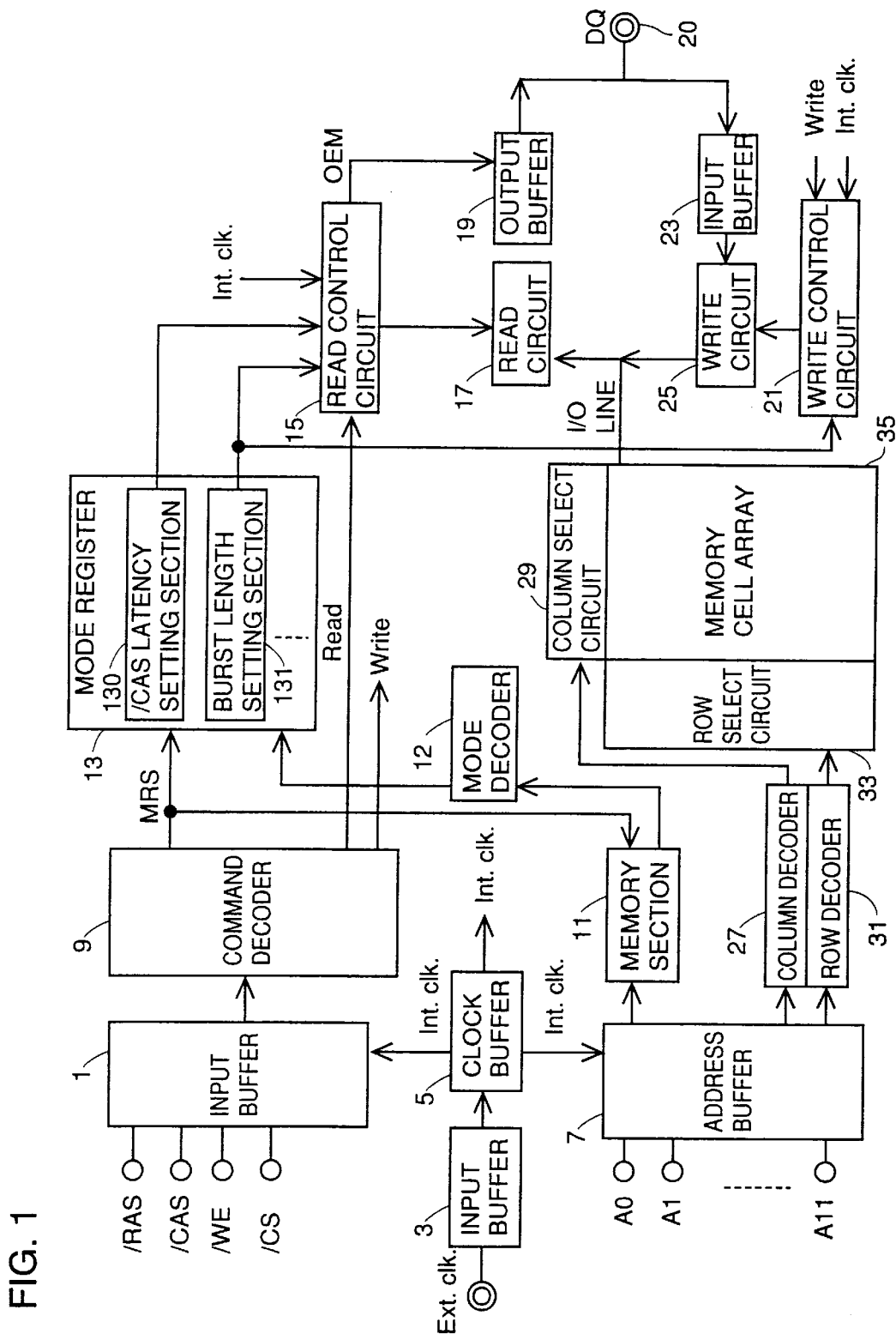
FIG. 1 is a block diagram of a synchronous semiconductor memory device in accordance with a best mode for carrying out the present invention.

Hereinafter with reference to the drawings, a synchronous semiconductor memory device as a best mode for carrying out the present invention will be described. In the drawings, the same character indicates the same or corresponding element.

With reference to FIG. 1, the synchronous semiconductor memory device in accordance with the present invention includes a data input/output terminal 20, a memory cell array 35 storing external data supplied as an input to data input/output terminal 20, a row select circuit 33 selecting a row in memory cell array 35 to which data is to be written into or from which data is to be read out, a column select circuit 29 selecting a column to which data is to be written into or from which data is to be read out, an input buffer 3 buffering an external clock signal Ext. clk., a clock buffer 5 generating an internal clock signal Int. clk. by buffering an output signal from input buffer 3, an input buffer 1 generating an internal control signals by receiving and buffering external control signals such as a row address strobe signal /RAS, a column address strobe signal /CAS, a write enable signal /WE, or a chip select signal /CS in synchronization with internal clock signal Int.clk. generated by clock buffer 5, an address buffer 7 generating an internal address signal by receiving and buffering external address signal (A0–A11) in synchronization with the internal clock signal Int. clk., a column decoder 27 driving column select circuit 29 by decoding a column address signal in the internal address signal, a row decoder 31 driving row select circuit 33 by decoding a row address signal in the internal address signal, a command decoder 9 generating and supplying as an output a read instruction signal Read, a write instruction signal Write, and a mode register set signal MRS in accordance with a combination of row address strobe signal /RAS, column address strobe signal /CAS and write enable signal /WE sent to input buffer 1 as inputs, a mode register 13 including a /CAS Latency setting section 130, a Burst Length setting section 131, a burst type setting section (not shown) and so on, and setting an operation mode such as /CAS Latency or Burst Length in accordance with a combination of external address signal bits A0–A11 supplied as an input to address buffer 7 in response to an input of mode register set signal MRS, a memory section 11 storing the internal address signal and mode register set signal MRS for setting the operation mode, a mode decoder 12 decoding and supplying a signal stored in memory section 11 to mode register 13, a read control circuit 15 generating an output enable signal OEM and a read control signal in accordance with the operation mode set in mode register 13 and in response to internal clock signal Int. clk. and read instruction signal Read, a read circuit 17 reading out data stored in memory cell array 35 in response to the read control signal, an output buffer 19 being activated by output enable signal OEM and buffering and supplying as an output data read out by read circuit 17 to data input/output terminal 20, a write control circuit 21 generating a write control signal in accordance with the operation mode set in mode register 13, and in response to internal clock signal Int. clk. and write instruction signal Write, an input buffer 23 buffering external data supplied as an input to data input/output terminal 20 and a write circuit 25 writing into memory cell array 35 data supplied as an output from input buffer 23 in response to the write control signal.

Figure 2:
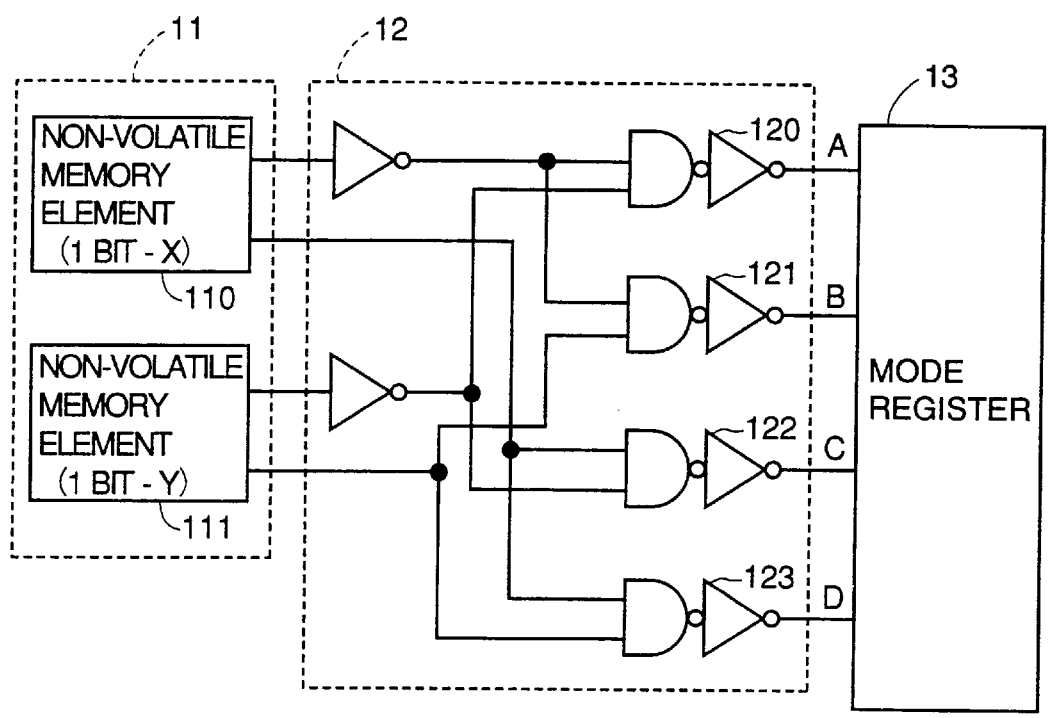
FIG. 2 is a schematic block diagram of a memory section and a mode decoder shown in FIG. 1, referenced for describing their operations.

FIG. 2 is a schematic diagram showing configurations of memory section 11 and mode decoder 12.

As shown in FIG. 2, memory section 11 includes, for example, two non-volatile memory elements 110 and 111 each storing 1 bit information, and mode decoder 12 includes an inverter, and an NAND circuit.

Next, the operation of the synchronous semiconductor memory device will be described.

When row address strobe signal /RAS, column address strobe signal /CAS, write enable signal /WE and chip select signal /CS are all supplied as an input to input buffer 1 in a logical low level state in response to the internal clock signal, command decoder 9 supplies, as an output, mode register set signal MRS to mode register 13.

The mode register set signal MRS is stored in memory section 11 until a next mode register set signal MRS is supplied as an output from command decoder 9.

Mode register 13 having received the mode register set signal MRS, stores in memory section 11 a combination of external address signal bits A0–A11 supplied as an input to address buffer 7 and sets /CAS Latency and Burst Length respectively in /CAS Latency setting section 130 and Burst Length setting section 131 according to the combination. In particular, Burst Length is designated by combination of external address signal bits A0, A1 and A2 and /CAS Latency is designated by combination of external address signal bits A4, A5 and A6.

Here, on receiving read instruction signal Read, read control circuit 15 controls read circuit 17 in accordance with /CAS Latency and Burst Length set in mode register 13 in synchronization with internal clock signal Int. clk. and supplies as an output, output enable signal OEM for activating output buffer 19.

On the other hand, on receiving write instruction signal Write, write control circuit 21 controls write circuit 25 in accordance with Burst Length set in mode register 13 in synchronization with internal clock signal Int. clk.

When the synchronous semiconductor memory device is powered off, /CAS Latency and Burst Length set in mode register 13 are lost. At the power on, however, /CAS Latency, Burst Length and so on are set again in mode register 13 to the same values as immediately before the power off in accordance with the mode register set signal MRS and the internal address signal stored in memory section 11.

Operations of memory section 11 and others will be described referring to FIG. 2.

Assume that memory section 11 includes two 1-bit non-volatile memory elements 110 and 111, for example, that store address information (X,Y). If (0, 0) is stored as (X,Y) at the power off, memory section 11 supplies (0, 0) as an output at the power on, and an output signal A from an inverter 120 of mode decoder 12 will be "1" and output signals B, C, and D from inverters 121, 122, and 123 will be all "0". Thus the operation modes such as /CAS Latency, which is determined by the signal A taking the value "1", are reset.

When (0, 1) is stored as (X, Y), only the output signal B from inverter 121 is "1". If (1, 0) is stored, only the signal C, and if(1, 1) is stored, only the signal D is "1".

Particularly, an EPROM (Electrically Programmable Read Only Memory), an EEPROM (Electrically Erasable and Programmable Read Only Memory) or the like can be used as the non-volatile memory elements 110 and 111. If the element is overridable, rewriting is possible for a number of times.

With the synchronous semiconductor memory device described above, troublesome setting of operation modes such as /CAS Latency at the power on can be avoided, because information for setting operation modes such as /CAS Latency and Burst Length is stored in memory section 11 including the non-volatile memory element.

In the foregoing, memory section 11 may be included in mode register 13 and stores mode register set signal MRS supplied as an input to mode register 13 and an output signal from mode decoder 12. The same advantages can be obtained as well when memory section 11 is in mode register 13 and stores an output signals from /CAS Latency setting section 130 and Burst Length setting section 131.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device, comprising:

a memory storing data;

a clock signal buffer buffering an external clock signal to generate an internal clock signal;

an input buffering responsive to said internal clock signal and buffering an external control signal to generate an internal control signal;

an address buffer responsive to said internal clock signal and buffering an external address signal to generate an internal address signal;

a mode register in which operation mode can be set designating a reading procedure of said data from said memory and a writing procedure of external data into said memory;

a data reading circuit reading said data stored in said memory in response to said operation mode set in said mode register and in response to said internal clock signal and a read signal;

a data writing circuit writing external data into said memory in response to said operation mode set in said mode register and in response to said internal clock signal and a write signal;

a command decoder generating a mode set signal for setting said operation mode in said mode register in response to said internal control signal and generating said read signal and said write signal; and a non-volatile memory storing said mode set signal and said internal address signal and supplying said stored mode set signal and said stored internal address signal to said mode register.

* * * * *